US009590133B1

(12) United States Patent
Welser et al.

(10) Patent No.: US 9,590,133 B1
(45) Date of Patent: Mar. 7, 2017

(54) THIN FILM SOLAR CELLS ON FLEXIBLE SUBSTRATES AND METHODS OF CONSTRUCTING THE SAME

(71) Applicant: Magnolia Solar, Inc., Woburn, MA (US)

(72) Inventors: Roger E. Welser, Providence, RI (US); Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 0 days.

(21) Appl. No.: 14/818,274

(22) Filed: Aug. 4, 2015

Related U.S. Application Data

(62) Division of application No. 12/885,718, filed on Sep. 20, 2010, now abandoned.

(60) Provisional application No. 61/293,469, filed on Jan. 8, 2010.

(51) Int. Cl.

| | |
|---|---|
| H01L 31/18 | (2006.01) |
| H01L 31/0445 | (2014.01) |
| H01L 31/048 | (2014.01) |
| H01L 31/0216 | (2014.01) |
| H01L 31/0224 | (2006.01) |
| H01L 31/0203 | (2014.01) |

(52) U.S. Cl.
CPC ...... *H01L 31/1884* (2013.01); *H01L 31/0203* (2013.01); *H01L 31/02168* (2013.01); *H01L 31/022425* (2013.01); *H01L 31/022475* (2013.01); *H01L 31/048* (2013.01); *H01L 31/0445* (2014.12)

(58) Field of Classification Search
CPC . H01L 31/048; H01L 31/0481; H01L 31/065; H01L 31/0749; H01L 31/0522; H01L 31/02167; H01L 31/02165; H01L 31/02168; H01L 31/1884
See application file for complete search history.

(56) References Cited

U.S. PATENT DOCUMENTS

| | | | |
|---|---|---|---|
| 4,583,822 | A | 4/1986 | Southwell |
| 5,252,142 | A | 10/1993 | Matsuyama et al. |
| 6,140,570 | A | 10/2000 | Kariya |

(Continued)

FOREIGN PATENT DOCUMENTS

WO 2008059170 A2 5/2008

OTHER PUBLICATIONS

Poxson et al., "Quantification of porosity and deposition rate of nanoporous films grown by oblique-angle deposition", Applied Physics Letters, 2008.*

(Continued)

*Primary Examiner* — Matthew Martin
(74) *Attorney, Agent, or Firm* — Loginov & Associates, PLLC; William A. Loginov (57) ABSTRACT

Material and antireflection structure and methods of manufacturing are provided that produce efficient photovoltaic power conversion from thin film solar cells on flexible substrates. Step-graded antireflection structures are placed on the front of the device structure. Materials of different energy gap are combined in the depletion region of at least one of the semiconductor junctions within the thin film device structure. Conductive, low refractive index layers are deposited on the bottom of the thin film device structure to form an omni-directional back reflector contact.

5 Claims, 7 Drawing Sheets

(56) References Cited

U.S. PATENT DOCUMENTS

| | | | |
|---|---|---|---|
| 7,483,212 | B2 | 1/2009 | Cho et al. |
| 7,553,691 | B2 | 6/2009 | Fatemi et al. |
| 2001/0047819 | A1 | 12/2001 | Sannomiya et al. |
| 2004/0200523 | A1 | 10/2004 | King et al. |
| 2005/0109392 | A1 | 5/2005 | Hollars |
| 2007/0137695 | A1 | 6/2007 | Fetzer et al. |
| 2008/0121269 | A1 | 5/2008 | Welser et al. |
| 2009/0020149 | A1* | 1/2009 | Woods .......... H01L 21/385 136/244 |
| 2009/0101209 | A1 | 4/2009 | Sharma et al. |
| 2009/0250100 | A1 | 10/2009 | Hayes et al. |
| 2010/0089444 | A1 | 4/2010 | Thomsen et al. |
| 2010/0101649 | A1 | 4/2010 | Huignard et al. |

OTHER PUBLICATIONS

Alemu, et al., "Dependence of Device Performance on Carrier Escape Sequence in Multi-Quantum-Well p—i—n Solar Cells", "Journal of Applied Physics", May 4, 2006, pp. 084506-1-084506-5, vol. 99, No. 084506, Publisher: American Institute of Physics, Published in: US.

Kim, et al., "GaInN Light-Emitting Diode With Conductive Omni-directional Reflector Having a Low-Refractive-Index Indium-Tin Oxide Laye", "Applied Physics Letters", Jan. 3, 2006, pp. 013501-1-013501-3, vol. 88, No. 013501, Publisher: American Institute of Physics.

Mochizuki, et al., "GaInP/GaAs Collector-Up Tunneling-Collector Heterojunction Bipolar Transistors (C-Up TC-HBTS): Optimization of Fabricat", "Transactions on Electron Devices", Dec. 2000, pp. 2277-2283, vol. 47, No. 12, Publisher: IEEE, Published in: US.

Asbeck, et al., "Heterojunction Bipolar Transistor Technology", "Introduction to Semiconductor Technology: GaAs and Related Compounds", May 1990, p. 170; 179-187; 195-203, Publisher: John Wiley & Sons, Published in: US.

Yusoff, et al., "Hydrogenated Nanocrystalline Silicon Germanium Thin Films", "PRAMA—Journal of Physics", Aug. 2007, pp. 285-300, vol. 69, No. 2, Publisher: Indian Academy of Sciences, Published in: IN.

Henry, "Limiting Efficiencies of Ideal Single and Multiple Energy Gap Terrestrial Solar Cells", "Journal of Applied Physics", Apr. 9, 1980, pp. 4494-4500, vol. 51, No. 8, Publisher: American Institute of Physics, Published in: US.

Matheu, et al., "Metal and Dielectric Nanoparticle Scattering for Improved Optical Absorption in Photovoltaic Devices", "Applied Physics Letters", Sep. 18, 2008, pp. 113108-1-113108-3, vol. 93, No. 113108, Publisher: American Institute of Physics, Published in: US.

Xi, et al., "Optical Thin-Film Materials With Low Refractive Index for Broadband Elimination of Fresnel Reflection", "Letters", Mar. 2007, pp. 176-179, vol. 1, Publisher: Nature Publishing Group.

Dodd, et al., "Surface and Perimeter Recombination in GaAs Diodes: An Experimental and Theoretical Investigation", "Transactions on Electron Devices", Jun. 1991, pp. 1253-1261, vol. 38, No. 6, Publisher: IEEE, Published in: US.

Wei, et al., "Thermodynamic Limits of Quantum Photovoltaic Cell Efficiency", "Applied Physics Letters", 2007, pp. 223507-1-223507-3, vol. 91, No. 223507, Publisher: American Institute of Physics, Published in: US.

\* cited by examiner

THIN FILM SOLAR CELLS ON FLEXIBLE SUBSTRATES AND METHODS OF CONSTRUCTING THE SAME

RELATED APPLICATIONS

This application is a divisional of co-pending U.S. patent application Ser. No. 12/885,718, filed Sep. 20, 2010, entitled THIN FILM SOLAR CELLS ON FLEXIBLE SUBSTRATES AND METHODS OF CONSTRUCTING THE SAME, which application claims the benefit of U.S. Provisional Patent Application Ser. No. 61/293,469, filed on Jan. 8, 2010, entitled EFFICIENT SOLAR CELL EMPLOYING MULTIPLE ENERGY-GAP LAYERS AND LIGHT-SCATTERING STRUCTURES AND METHODS FOR CONSTRUCTING THE SAME, the entirety of each of the above applications being expressly incorporated herein by reference.

FIELD OF THE INVENTION

This invention relates to semiconductor-based photovoltaic energy converters, also known as "solar cells," and to the design and fabrication of the same.

BACKGROUND OF THE INVENTION

With appropriate electrical loading, photovoltaic solid state semiconductor devices, commonly referred to as solar cells, convert sunlight into electrical power by generating both current and voltage upon illumination. The current sources in a solar cell are charge carriers that are created by the absorption of photons by the solid state semiconductor device. These photogenerated carriers are typically separated and collected by the use of PN or PIN junctions in the solid state semiconductor devices. The operational voltage of photovoltaic devices is limited by the dark diode current characteristics of the underlying PN or PIN junction(s). Thus improving the power output performance of any solid state solar cell entails simultaneously maximizing absorption and carrier collection while minimizing dark diode current.

Photovoltaic (PV) technologies that convert sunlight directly into electricity hold great promise as a sustainable, environmentally friendly energy source for the 21st century. However, power generation with conventional, crystalline-based silicon technologies is limited both in terms of performance and manufacturing costs. Various organic and inorganic thin film solar cell technologies have been developed that promise to lower the costs of photovoltaic power, but are much lower in solar electric power conversion efficiency. Current thin film technologies are thus a poor use of land resources, and are not suitable for applications constrained in area.

Compared with crystalline wafer cells, thin film solar cells require only a fraction of the semiconductor material and can be deposited on lower cost glass and flexible substrates, thus offering significantly lower manufacturing costs. While a number of different materials can be used to construct thin film cells, silicon-based materials are particularly attractive due to their abundance and lack of toxicity. However, the conversion efficiency of the best silicon thin film solar cells is in the range of 8-12%, compared to almost 25% for state-of-the-art wafer silicon devices. Because current thin-film cells have a significantly lower efficiency than conventional silicon modules, they are limited to installation sites that are not constrained by available real estate area and may not produce enough electrical power per unit area to be economically viable in many locations. Therefore, it is desirable to provide design strategies and processes that can maximize both the photocurrent generating capability of silicon and other thin film solar cell devices and their voltage output.

The operating voltage of a semiconductor solar cell is generally dictated by the underlying dark diode current of the device. The dark diode current of semiconductor devices is composed of several different components, all of which are dependent upon the energy gap of the material used in the active junction of the device. Typically, each cell in a solar cell consists of one type of material, and the energy gap of that material influences both the current and voltage output of the device. Lower energy gap material can enhance the current generating capability, but typically results in a lower operating voltage. Therefore, it is desirable to provide a device and a method that can harness the current generating capabilities of narrow energy gap material while also maintaining a high operating voltage.

SUMMARY OF THE INVENTION

This invention overcomes the disadvantages of the prior art by providing a thin film solar cell structure and method of manufacturing that increases the power output of thin film solar cells on flexible substrates. The various illustrative embodiments reduce reflection losses, thus maximizing the current generating capability of the device. The various illustrative embodiments further utilize different energy gap material within at least one of the subcells to actively maximize the tradeoffs between current and voltage outputs. The various illustrative embodiments further combine narrow and wide energy gap material to both minimize dark diode current while maintaining current generation. When fully functionalized, the various illustrative embodiments by their individual elements, or in combination, increase the power output of thin film solar cells by enhancing the voltage and current generating capability of the thin film photovoltaic devices.

In the illustrative embodiment, the material structure of the active region of one or more of the subcells within a thin film solar cell device where photo-generated carriers are created and separated is modified. Notably, the basic active region structure of at least one of the subcells consists of a PN or PIN junction which contains materials of different energy gap within the junction depletion region. Moreover, different energy gap material layers within the active region are repositioned as a part of the design elements. In an illustrative embodiment, wider energy gap material is incorporated with lower energy gap material into the active region of the device to improve the operational voltage of the device and the absorption of photocurrent within the thin active region of the device to overcome deficiencies in the previous thin film solar cells. By way of example, lower energy gap material such as SiGe is employed to increase the absorption coefficient over a wide range of photon energies, while wide band gap material, such as Si and SiC, are employed to lower the generation of dark diode current in the active depletion region and enhance the operational voltage of the solar cell. The SiGe materials can be amorphous, polycrystalline, microcrystalline, or nanocrystalline, and can range over the entire compositional range from 100% Si to 100% Ge. By way of another example, cadmium telluride (CdTe) and copper indium gallium diselenide (CIGS) materials can be mixed together within the junction depletion region of the device. In another embodiment, the semiconductor thin film solar cell device structure comprises at least in parts of at least one of amorphous silicon material, microcrystalline silicon material, cadmium telluride material, copper indium gallium diselenide material, silicon germanium material, and nanocrystalline silicon germanium material, and other semiconductor thin film material. In another illustrative embodiment, a thin film solar cell device comprises at least one subcell on a flexible substrate superstrate containing materials with at least two distinct energy gaps within a junction depletion region, such as SiGe and SiC.

In another illustrative embodiment, antireflection layers of transparent refractive thin film are deposited on the front, sun-facing surface of semiconductor thin film solar cell. The purpose of the antireflection layers is to maximize the number of incident photons that are directed into the active region of semiconductor thin film solar cell device. The antireflection structure further serves as both a protective window and encapsulant for the semiconductor thin film device structure. The antireflection structure is formed of multiple layers of optical thin film material on top of a transparent encapsulant, while having an index of refraction intermediate between that of the encapsulant and air. Moreover, a second antireflection layer of transparent refractive thin film is formed between the encapsulant and the thin film device structure. The second antireflection layer can comprise of multiple layers of transparent conductive thin film material, each of which has an index of refraction intermediate between that of the encapsulant and the semiconductor thin film solar cell device structure. The first and second antireflection layers can comprise in full or in part an optical thin film material and an epitaxial semiconductor material. The multiple layers of the first and second antireflection layers are configured and arranged to form a series of discrete steps having an index of refraction of a predetermined profile. In the illustrative embodiment, the profile is characterized by a quintic profile to provide maximal photon transmission through the antireflection layers. The exact thickness and index of refraction of each of the layers in the antireflection layer can be adjusted to further minimize reflection losses over a broad spectrum of photon wavelengths and angles of incidence.

In another illustrative embodiment, a back reflector with high reflectivity is employed below the active region of the semiconductor thin film solar cell device structure of the PV device. The purpose of the back reflector is to reflect unabsorbed photons back into the active region of the semiconductor thin film solar cell device, giving the photon a greater probability of being absorbed by the device active region and to generate current. In the illustrative embodiment, the back reflector consists of layers of a Transparent Conducting Oxide (TCO) material. The TCO material can be further combined with a layer of conductive metal to form a conductive Omi-Directional Reflector (ODR). This conductive ODR structure serves dual purposes, both recycling unabsorbed photons and providing for a back electrical contact to the solar cell device. In another embodiment, the back contact can be deposited to the semiconductor thin film solar device structure and configured and arranged to direct photons from the semiconductor thin film solar device structure back to device active region. In another embodiment, the ODR structure can be composed of indium tin oxide material.

A method of constructing the improved thin film photovoltaic module described herein consists of coating the top surfaces of a thin film solar cell with nanostructured optical coatings. Thin films of semiconductor material are deposited on flexible substrates such as stainless steel, titanium, polyurethane and other high durability flexible polymers. Appropriate contacts are formed to the front, sun-facing side of the active device, and to the back of the device. In particular, conductive dielectric and metal layers are deposited on the back surface of the semiconductor device to form an ODR structure. In an alternate embodiment, a method of manufacturing a thin solar cell comprising the steps of coating the top surfaces of a semiconductor thin film solar cell device structure with optically transparent coatings and encapsulants.

In an illustrative embodiment, a photovoltaic device having a front surface and a back surface, coated with a transparent refractive film on at least one of the front surface and the back surface of the device structure. A semiconductor thin film solar cell device structure having a device active region configured and arranged to generate charge current upon incident of photons from light on the device active region is deposited onto a flexible substrate along with optical coatings that direct the photons from the light to the semiconductor thin film solar cell device active region.

In another illustrative embodiment, the transparent refractive film coated on the front surface between the semiconductor thin film solar cell device structure and the encapsulant comprises a plurality of material with refractive indices between the refraction index of the encapsulant and the refraction index of the semiconductor thin film solar cell device structure over a plurality of discrete steps characterized by a quintic profile. The transparent refractive film coated on the front surface can be composed substantially of a transparent conductive oxide material configured and arranged as a porous or dense layer of varying thicknesses.

In another embodiment, the transparent refractive film coated on the front surface between the encapsulant and the ambient air comprises a plurality of materials with refractive indices between the refractive index of air to the refractive index of the encapsulant over a plurality of discrete steps characterized by a quintic profile. The transparent refractive film coated on the front surface can be composed substantially of $SiO_2$ configured and arranged as a porous or dense layer of varying thicknesses.

BRIEF DESCRIPTION OF THE DRAWINGS

The invention will be readily understood by the following detailed description in conjunction with the accompanying drawings, wherein like reference numerals designate like structural elements, and in which.

The drawings are not necessarily to scale with emphasis instead being placed upon illustrating embodiments of the present invention.

DETAILED DESCRIPTION

Figure 1:
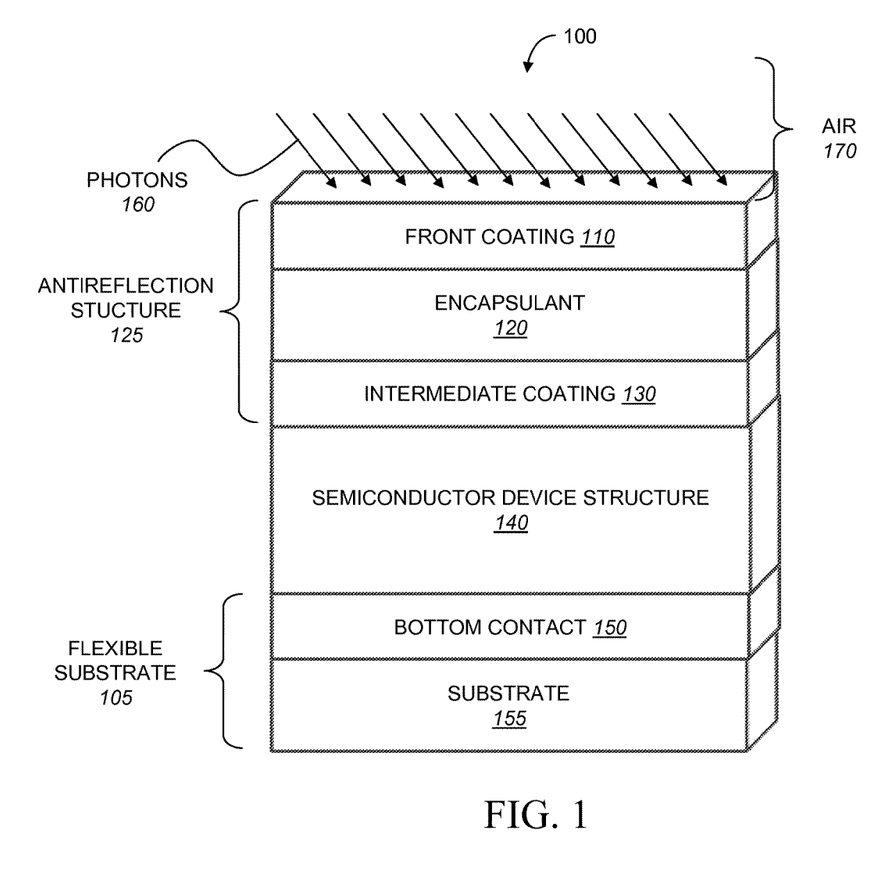
FIG. 1 is a schematic side cross section of a semiconductor thin film solar cell device structure deposited on a flexible substrate, according to an illustrative embodiment.
Figure 2:
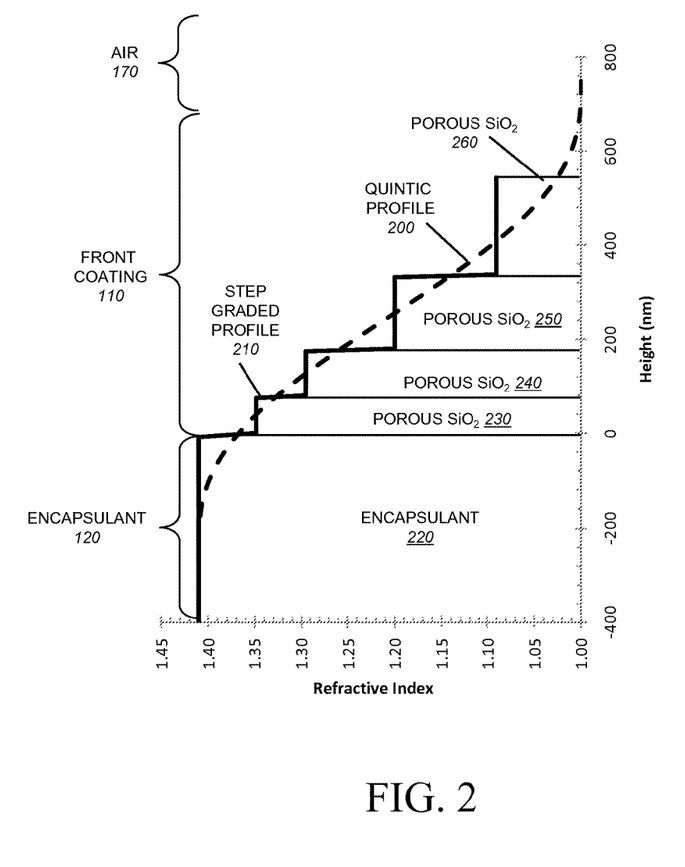
FIG. 2 is a graph showing index of refraction versus position for a step-graded antireflection coating on the top side of a encapsulated semiconductor device structure configured and arranged to face the sun to enhance optical transmission of photon energies into the active regions of the underlying thin film solar cell, according to the illustrative embodiment.

FIG. 1 details a cross sectional view illustrating a partial thin film solar cell structure 100 comprising a semiconductor thin film solar cell device structure 140 deposited on a flexible substrate 105. The flexible substrate 105 incorporates both a structural substrate 155 and a bottom contact 150. The thin film solar cell structure 100 includes an antireflection structure 125 to enhance photon absorption within the active region of the semiconductor structure 140. According to the illustrative embodiment, the front coating 110 is deposited on a device coated with transparent encapsulant 120 configured and arranged in a photovoltaic (PV) system arranged to face the sun, which provides a readily available source of photon energies 160 to the PV system. The front coating 110 is comprised of materials possessing optical characteristics having index of refractions between air 170 and the encapsulant 120. Refer to FIG. 2 showing examples of the refractive index. An intermediate coating 130 is applied to the top side of semiconductor device structure 140 prior to encapsulation and consisting of materials possessing index of refractions between that of encapsulant 120 and the underlying semiconductor structure 140. Refer to FIG. 2 for examples of the refractive index. The reflective bottom contact 150 is on the surface of the structural substrate 155. Although photons 160 are illustratively shown as a series of a single direction of photon stream, it should be clear to those skilled in the art that the various, illustrative, and alternate embodiments will function with various varying degrees and/or amount of incident of light or source of photon energies.

In various embodiments, front coating 110 and intermediate coating 130 are configured and arranged with transparent antireflection coating structures to reduce the reflection of incident photons at the material interface between air 170 and front coating 110 and the interface encapsulant 120 and semiconductor device structure 140, respectively. In the various embodiments, front coating 110 and intermediate coating 130 are implemented in accordance with industry standard processes and materials known to those skilled in the art. Transparent antireflection coating structures can comprise a single layer or multiple layers of materials having an index of refraction intermediate between the semiconductor structure 140 and the media in which the incident photons are delivered, which by way of example is illustrated as air 170 in FIG. 1. Single-layer transparent antireflection coating structures are generally characterized as refracting only at a single wavelength of light when the light is at normal incidence to the transparent antireflection coating structure surface. In alternate embodiments, graded-index coatings with variable-index profiles are utilized. By way of example, a quintic profile is illustrated at near optimum profile for a graded-index antireflection coating (see, for example, by way of useful background information, U.S. Pat. No. 4,583,822, entitled QUINTIC REFRACTIVE INDEX PROFILE ANTIREFLECTION COATINGS, by W. H. Southwell, the teachings of which are expressly incorporated herein by reference as useful background information). The various illustrative and alternate embodiments utilize optical materials with very low refractive indices that closely match the refractive index of air, which historically have not been utilized.

Oblique-angle deposition is utilized as an effective technique for tailoring the refractive index of a variety of thin film materials (see for example, by way of useful background, J.-Q. Xi, M. F. Schubert, J. K. Kim, E. F. Schubert, M. Chen, S.-Y. Lin, W. Liu, and J. A. Smart, *Optical Thin-Film Materials with Low Refractive Index for Broad-Band Elimination of Fresnel Reflection*, Nat. Photon., vol. 1, pp. 176-179, 2007). Oblique-angle deposition is a method of growing nanostructured, porous thin films, and hence thin films with low-refractive index (low-n), enabled by surface diffusion and self-shadowing effects during the deposition process. Both conducting and non-conducting graded-index antireflection coatings that are broadband and Omni-directional have been demonstrated using this deposition technique. As taught by Cho et al. in U.S. Pat. No. 7,483,212, by way of background, both oblique angle deposition and co-sputtering are material synthesis techniques that can be used to construct multiple layer, graded refractive index coatings to minimize reflection losses. The teachings of this patent are expressly incorporated herein by reference as useful background information. It is contemplated in illustrative embodiments that these processes can be adapted to minimize reflection losses in thin film solar cells on flexible substrates. It is further contemplated that other processes can be adapted for thin film deposition including such semiconductor deposition tool as metal-organic chemical vapor deposition (MOCVD) or molecular beam epitaxy (MBE). It should be apparent to those skilled in the art that various other techniques when made available can be employed to fabricate the structures of the described embodiment, herein.

According to the illustrated embodiments, light trapping techniques can be employed to dramatically improve thin film solar cell performance by increasing the optical path length of photons within the thin absorber layers. An illustrative implementation of light trapping employs a back reflector that functions to bounce any unabsorbed photons passing through the semiconductor thin film solar cell device structure into the active layers of the device, thus thereby increasing the probability of their absorption. Texturing of the back reflector surface and/or the addition of nanoparticles further provides a mechanism to enhance the optical path length of reflected photons through the device active region. Conventional metal reflectors can be employed, but have limited reflectivity, generally around 95%. Distributed Bragg Reflectors may be utilized to offer higher peak reflectivity, but are generally more complicated and are sensitive to the angle of incidence. In contrast, Omni-directional reflectors (ODRs), which combine a metal layer with a low-refractive index layer, provide ultra-high reflectivity over a wide range of wavelengths and incident angles. High conductivity can be maintained in an ODR structure by using conductive material such as indium-tin oxide (ITO) nano-rods as the low refractive index material (see for example, by way of useful background information, J. K. Kim et al, *GaInN Light-Emitting Diode with Conductive Omnidirectional Reflector having a Low-Refractive-Index Indium-Tin Oxide Layer*, Appl. Phys. Lett., vol. 88, no. 012501, January 2006). The use of an ODR structure as the bottom contact 150 in FIG. 1 is specifically contemplated herein. Such an ODR structure could consist of porous, low index ITO (n~1.2) sandwiched between the back side of the semiconductor structure 140 and an underlying layer of metal (not shown).

The refractive index of front coating 110 is shown on top of the underlying encapsulant 120 in FIG. 2 according to the illustrative embodiment. One example of a continuously varying quintic profile 200 of the index of refraction approximated by a step graded profile 210 is taught in U.S. Pat. No. 4,583,822, which is incorporated by reference as useful background information. In particular, the index of refraction, herein referred to as "n", is varied from that of the encapsulant 120, which is composed of transparent material 220 having a reflection value "n" of approximately 1.4, to that of air 170, which is shown by way of example to be approximately 1. Fresnel reflection from uncoated encapsulants generally varies from near 3% at normal incidence to over 35% at an incident angle of 75°. While dense $SiO_2$ is an optically transparent material, it has an index of refraction comparable to common silicon encapsulants (n~1.47). Thus, in conventional implementations, $SiO_2$ is not typically used to reduce reflection losses. However, according to the illustrative embodiment, oblique angle deposition is employed to produce porous $SiO_2$ layer with lower index of refraction. More particularly, the index of refraction of front coating 110 is varied from 1.41 to 1.09 over four discrete steps, which can consist of 75 nm of porous $SiO_2$ material 230 (n~1.35), 100 nm of porous $SiO_2$ material 240 (n~1.29), 160 nm of porous $SiO_2$ material 250 (n~1.20), and 210 nm of porous $SiO_2$ material 260 (n~1.09). This particular combination of index of refraction and layer thicknesses illustratively provides an appropriate approximation of the quintic profile 200, as shown in FIG. 2. It should be clear to those skilled in the art that the number of discrete steps and the illustrated refraction index are only shown for illustrative purposes and that the number of discrete steps and various values of refractive index can be varied according to the various embodiments.

Figure 3:
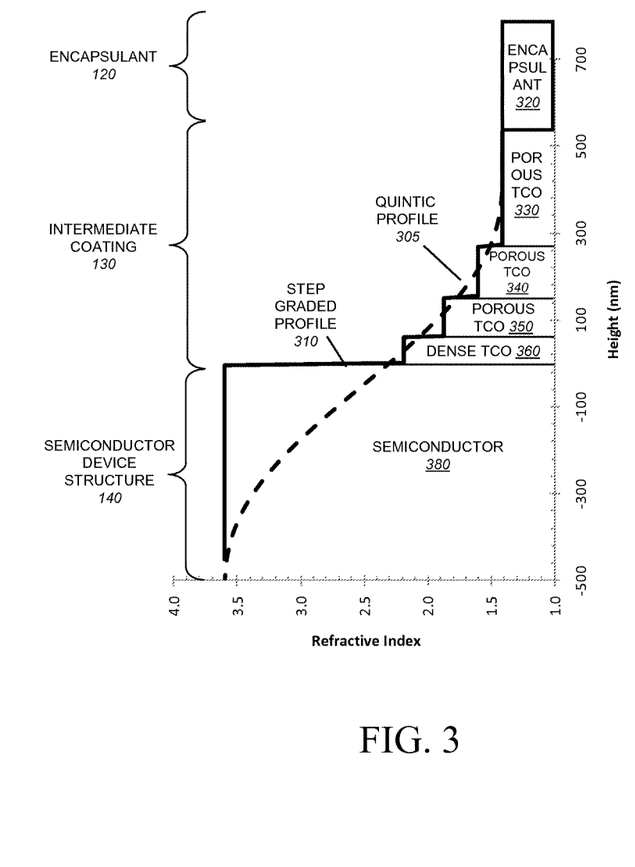
FIG. 3 is a graph showing index of refraction versus position for a step-graded antireflection coating between a semiconductor device structure and a transparent encapsulant to enhance optical transmission into the active regions of the underlying thin film solar cell, according to the illustrative embodiment.

In the illustrative embodiment, the refractive index profile for at least part of a thin film solar cell including the top surface of a semiconductor device structure 140, intermediate coating 130, and encapsulant 120 is shown in FIG. 3. According to the illustrative embodiment, the index of refraction (n) of an encapsulant 120 comprising of a protective transparent encapsulant material 320 having a refraction index value of 1.4 is varied to that of semiconductor device structure 140 comprising of semiconductor material 380 having a refraction index value of approximately 3.0 or higher. By way of example, the Fresenel reflection between typical encapsulant material (n~1.4) and silicon (n~3.6) can vary from over 19% at normal incidence to nearly 66% at an incident angle of 75°. A continuously varying quintic profile 300 of the index of refraction, such as that taught in U.S. Pat. No. 4,583,822, can be approximated by a step graded profile 310. By way of example, the index of refraction is varied from 1.41 to 3.6 over four discrete steps, which can consist of 260 nm of porous TCO layer 330 (n~1.41), 125 nm of porous TCO layer 340 (n~1.6), 90 nm of porous TCO 350 (n~1.88), and 65 nm of dense TCO 360 (n~2.19).

In a further embodiment, a transparent conductive oxide such as indium tin oxide (ITO) is employed to form a conductive, low resistance film. This film acts as a transparent contact further helping to draw current out of the top of the solar cell device. In a still further embodiment, non-conducting materials such as $SiO_2$ and $TiO_2$ are employed for the materials 330, 340, and 350 adjoining encapsulant 320. In an illustrative embodiment, a thicker, dense TCO film material can be employed in a dense TCO layer 360 adjoining the semiconductor thin film solar cell device material 380.

The illustrative embodiments utilize materials having variable refractive indices. Fresnel reflection losses in a thin film solar cell on flexible substrates arise from the differences in index of refraction between air (n~1) and encapsulant (n~1.4) and between encapsulant (n~1.4) and the active semiconductor material (n~3.6), respectively. By varying the index of refraction in a quintic profile (by way of useful background information, refer to U.S. Pat. No. 4,583,822, which is incorporated by reference) using materials with a range of refractive indices having graded refractive index design, the Fresnel reflection losses in thin film solar cell are minimized. Additionally, the type of material with a desired refractive index often forces a compromise in other material properties such as optical transmittance and electrical conductivity that are also important photovoltaic applications. Thus, the ability to control the refractive index of thin film materials using high performance antireflection coating tailored for thin film solar cells on flexible substrates enables high performance optical coatings to approximate a quintic profile.

In the illustrative embodiments, $SiO_2$ and ITO materials are used due to the varying porosity and thus different index of refraction employable on thin film solar cells on flexible substrates. $SiO_2$ material is utilized for its high transmission and stability, and is employed on the top of the device to minimize reflection losses between air and encapsulant. While non-conductive materials are acceptable for the front coating, an intermediate coating in a thin film solar cell must be highly conductive to ensure efficient carrier collection with minimal resistance losses. Transparent conductive oxides are an exemplary class of materials that are both highly conductive and transmissive. ITO in particular is utilized as a transparent conductive oxide, and is employed herein to minimize reflection losses between encapsulant and the active semiconductor material. Because dense ITO only reaches an index of refraction of n~2.2, wide band gap semiconductor materials such as SiC are also employed to step grade the index of refraction all the way from encapsulant to the active semiconductor material which will absorb most of the photons in a solar spectrum. The combined use of optical thin film materials and semiconductor layers to step grade the index of refraction difference between encapsulant and the photovoltaic absorbing layers are approaches disclosed herein. The usage of optical material, such as $SiO_2$, ITO, and SiC, coupled with techniques for growing nano-porous structures enable for the deposition of optical material with very low refractive indices on encapsulant, historically have not been employed before.

Figure 4:
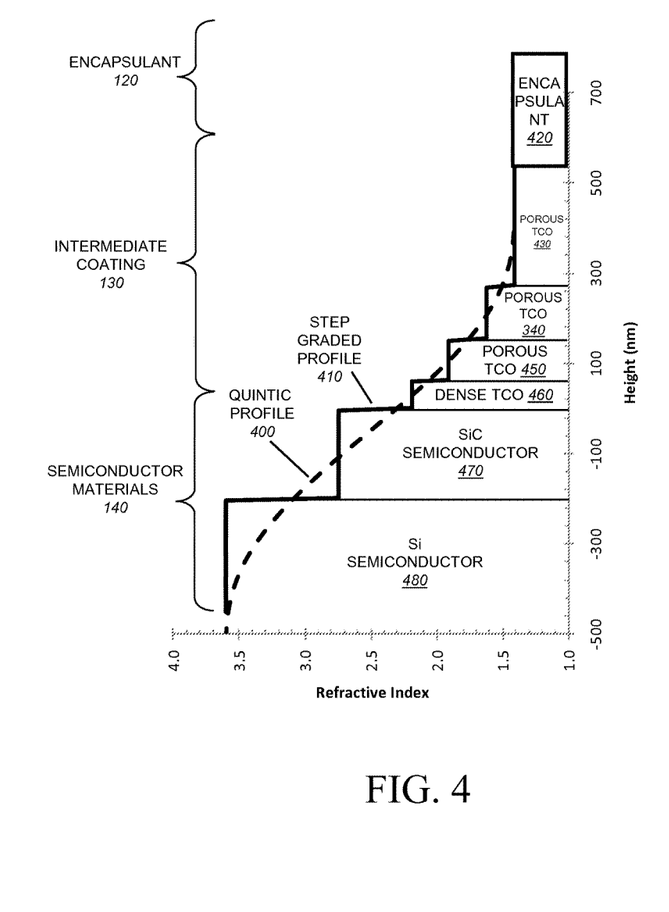
FIG. 4 is a graph showing index of refraction versus position for a step-graded antireflection coating employing a lower index semiconductor layer to enhance optical transmission of photon energies into the active regions of the underlying thin film solar cell, according to another illustrative embodiment.

In another illustrative embodiment, a semiconductor thin film solar cell device structure is composed of a multilayered structure of semiconductor thin films employing lower index of refraction semiconductor layers between the dense TCO and semiconductor materials in the active region of the solar cell device. By way of an illustrative embodiment as shown in FIG. 4, the index of refraction is varied from 1.41 to 3.6 over six discrete steps, which can consist of 260 nm of porous TCO 430 (n~1.41), 125 nm of porous TCO 440 (n~1.62), 90 nm of porous TCO 450 (n~1.91), 65 nm of dense TCO 460 (n~2.19), 200 nm of SiC 470 (n~2.75) and 200 nm or greater of Si 480 (n~3.6). The combination of index of refraction and layer thicknesses, as described herein, produces an appropriate approximation of the quintic profile 400. It should be clear to those skilled in the art that the number of discrete steps and the illustrated refraction index are only shown for illustrative purposes and that the number of discrete steps and various values of refraction index can be varied according to various embodiments. In an alternate embodiment, CdTe is employed in layer 470, while CIGS is used as the absorbing semiconductor material in layer 480.

The illustrative antireflection structures show particular combinations of layer thicknesses and index of refractions. However, it should be apparent to those skilled in the art that the number of layers, the variation of the layer thicknesses, the materials composition of the layers, and index of refractions of the layer can be varied according to the various embodiments. In particular, the use of semiconductor layers to step grade the index of refraction from semiconductor device structure to the optical material layers (e.g. ITO, $TiO_2$ or $SiO_2$). It should be further noted that semiconductor layers such as SiC and CdTe can be designed to simultaneously function as a window and a contact layer in the thin film photovoltaic devices.

The semiconductor structure 140 deposited on the flexible substrate 105 is coated over with intermediate coating 130, encapsulant 120, and front coating 110, as depicted in FIG. 1, and can consist of a wide range of device structures, including single, tandem, and triple junction devices built using a wide range of materials, including, but not limited to, amorphous silicon (Si), amorphous silicon germanium (SiGe), microcrystalline silicon (Si), nanocrystalline silicon germanium (SiGe), cadmium telluride (CdTe), and copper indium gallium diselenide (CIGS). In an illustrative embodiment, the semiconductor structure 140 consists of silicon-based thin film materials in a structure than combines an amorphous silicon junction with a microcrystalline silicon junction and/or an amorphous SiGe junction to form a material matrix structure. In another illustrative embodiment, the semiconductor device structure 140 consists of group II-VI material such as CdTe. In yet another illustrative embodiment, the semiconductor device structure 140 consists of CIGS material.

Advantageously, low energy-gap material incorporated throughout the absorbing layer of the semiconductor material enables the active region of the PV device to absorb a wider portion of the solar spectrum. However, the incorporation of narrow band gap material throughout the depletion region of a PN or PIN junction typically increases the dark diode current of the device, which results in a lower operating voltage in solar cell devices.

Figure 5:
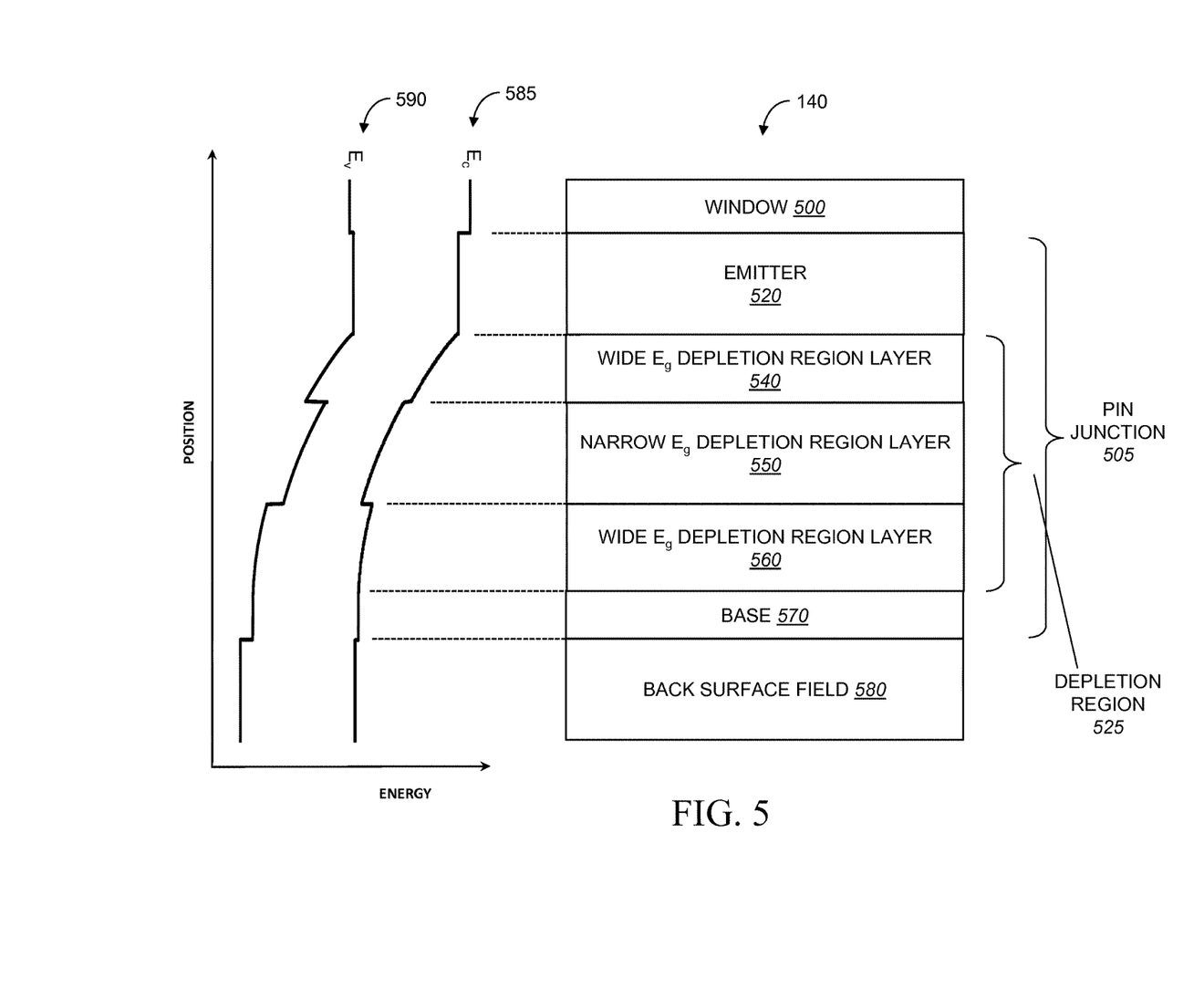
FIG. 5 is a diagram of the energy band versus position for a material structure of a semiconductor cell or subcell illustrating a junction depletion region having both narrow and wide energy gap material, according to the various embodiments.

The layered structures and associated energy bands graph depicted in FIG. 5, which is simplified to facilitate understanding, show the elements of semiconductor thin film solar cell device structure 140 according to the illustrative embodiment. Notably, the structure 140 simultaneously suppresses the dark diode current and enhances the photocurrent of a thin film cell or subcells and comprises of a window 500, a PIN junction 505, and a back surface field 580.

In the illustrative embodiment, the PIN junction 505 consists of an emitter 520, a base 570, and a depletion region 525 illustratively shown as a wide energy gap ($E_g$) depletion region layer 540, a narrow energy gap ($E_g$) depletion region layer 550, and a wide energy gap ($E_g$) depletion region layer 560. The depletion region is distinguished by the presence of a built-in electric field, a non-zero slope in the conduction band 585 ($E_c$) and valence band 590 ($E_v$), induced by the juxtaposition of p-type and n-type semiconductor material. In the illustrative embodiment, the depletion region is on the order of approximately 0.1 to 2 microns for thin film solar cells. It should be apparent to those skilled in the art that the thickness of the depletion region can be adjusted by varying the thickness of unintentionally doped material between the p-type and n-type material. Window 500 and back surface field 580 layers are typical solar cell structure deposit above and below the PIN junction 505.

In the illustrated embodiment, higher energy gap material is inserted into depletion region 525 adjacent to the emitter 520 to form a wide energy gap ($E_g$) depletion region layer 540. In contrast to previous art, the physical boundary between the different energy gap materials is offset from the physical boundary between the emitter and intrinsic/base materials. Higher energy gap material is also inserted into depletion region 525 adjacent to base 570 to form a second wide energy gap ($E_g$) depletion region layer 560. The wide energy gap depleted region layers reduce space charge recombination by replacing narrow energy gap material with wide energy gap material. In alternate embodiments, the depletion region 525 can consist of a single wide energy gap depletion layer (540 or 560). In an illustrative embodiment, the wide energy gap ($E_g$) depletion region layer 540 and 560 are a single material composition matching that of the emitter 520 and base 570, but is undoped or lightly doped to ensure that this additional higher energy gap material lies entirely within depletion region 525. In further embodiments, the depletion region consists of multiple layers with different energy gap materials. By way of example, a different energy gap material employed in the depletion layer 525 can be SiGe. In particular, SiGe is employed in a narrow energy gap layer 550 within the depletion region 525. SiGe has a higher absorption coefficient over a wide range of photon energies relative to traditional material such as silicon. SiGe can also absorb a wider spectrum of photon energies than silicon. The SiGe materials can be amorphous, polycrystalline, microcrystalline, or nanocrystalline, and can range over the entire compositional range from 100% Si to 100% Ge, with higher Ge concentrations desirable for generating higher currents. To counteract the negative impact of employing SiGe on the voltage output of thin film solar cells, higher energy gap material is used throughout the rest of the device structure.

Figure 6:
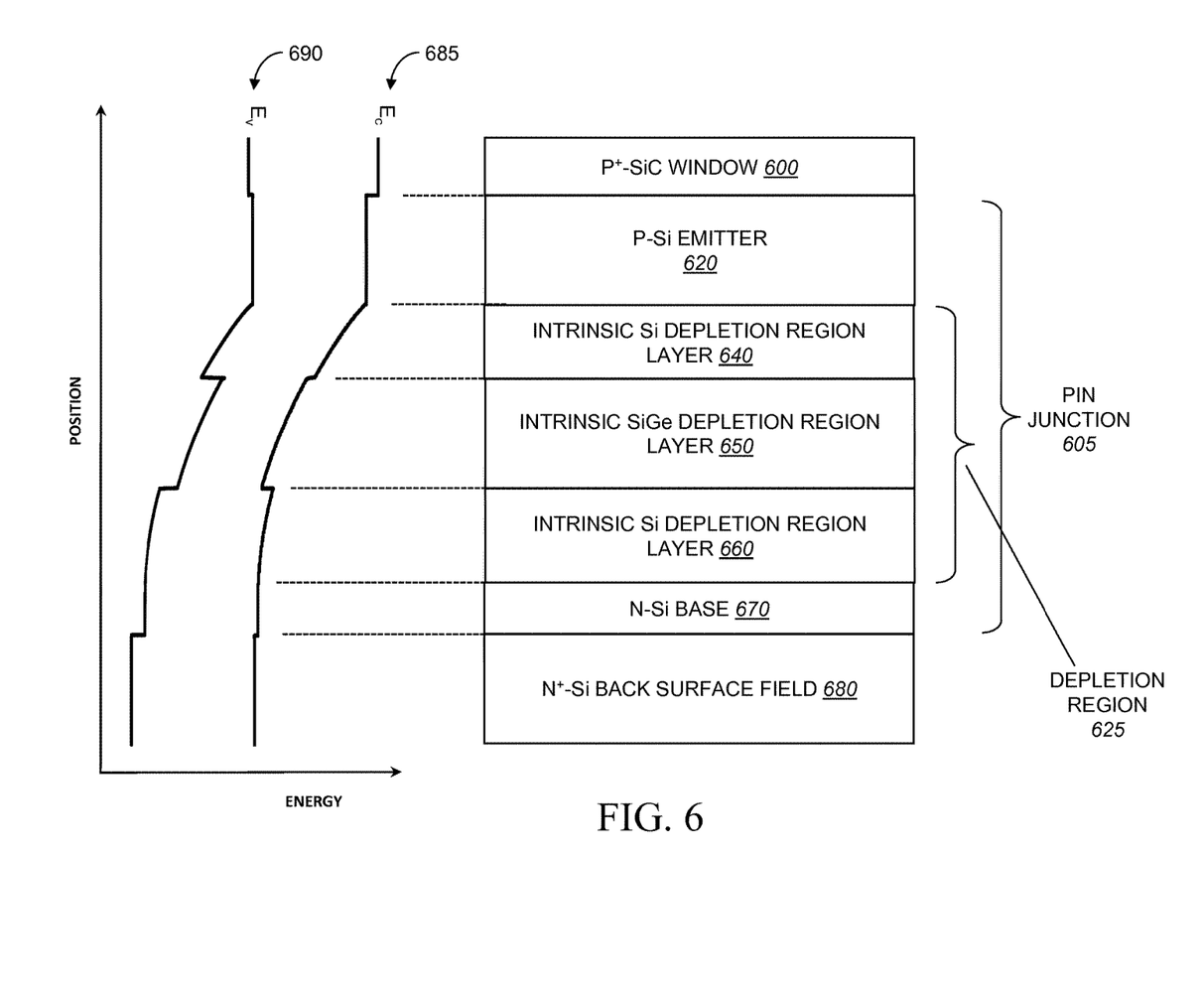
FIG. 6 is a diagram of the energy band versus position for a material structure of a semiconductor thin film solar cell illustrating a junction depletion region with both narrow and wide energy gap silicon-based material, according to the various embodiments.

By way of an illustrative embodiment shown in FIG. 6, the single material composition employed in wide energy gap ($E_g$) depletion region layers 640 and 660 is a silicon-based material. The material structure consists of a silicon thin film PIN junction 605 comprising an emitter 620, a base 670, and a depletion region 625 illustratively shown comprising a silicon based wide energy gap ($E_g$) depletion region layer 640, a silicon germanium based narrow energy gap ($E_g$) depletion region layer 650, and a silicon based wide energy gap ($E_g$) depletion region layer 660. The depletion region 625 is distinguished by the presence of a built-in electric field, illustrated by a non-zero slope in the conduction band 585 ($E_c$) and valence band 590 ($E_v$), induced by the juxtaposition of p-type and n-type semiconductor material. In the illustrative embodiment, the thickness of the depletion region is in the order of 0.1 to 1.1 microns for silicon thin film solar cells. It should be apparent to those skilled in the art that the thickness of the depletion can be adjusted by varying the thickness of unintentionally doped material between the p-type and n-type material. Window 600 and back surface field 680 layers are typical solar cell structure deposited above and below PIN junction 605. It should be further apparent to those skilled in the art that narrow energy gap ($E_g$) depletion region layer 650 and wide energy gap ($E_g$) depletion region layers 640 and 660 can be implemented in a wide variety of geometric structure, varying number of layers, and a wide variety of material systems, including but not limited to silicon-based materials and II-VI related materials such as CdTe and CIGS. The device structure illustrated in FIGS. 5 and 6 can further be employed as a single junction solar cell, or as part of one or more subcells in a tandem or triple junction device.

Figure 7:
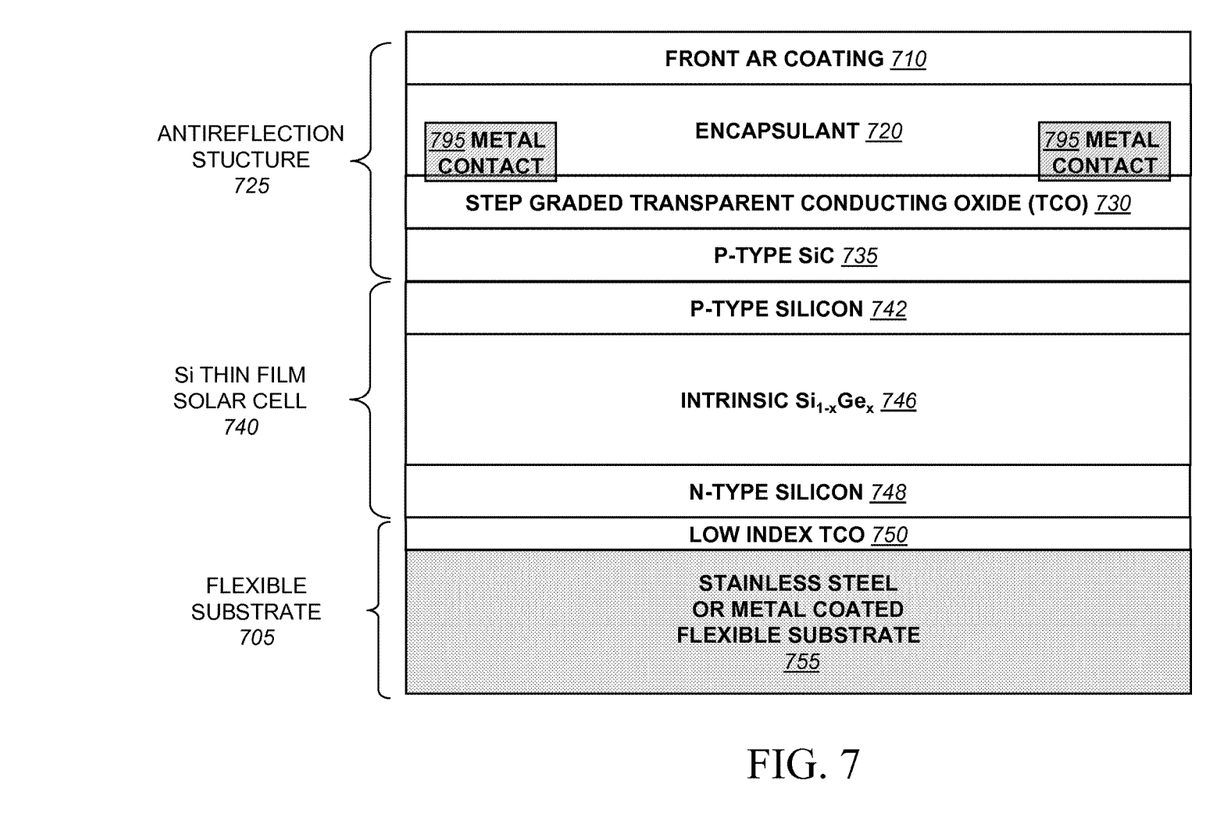
FIG. 7 is a schematic side cross section of a thin solar cell device on a flexible substrate illustrating an absorber layer using SiGe material and nanostructured optical coatings, according to an illustrative embodiment.

FIG. 7 depicts a photovoltaic device according to an illustrative embodiment incorporating a plurality of the structural and functional elements described above. In operation, incident light first encounters the front anti-reflection coating 710. After passing through the encapsulant 720, photons are transmitted through a transparent conductive oxide (TCO) 730 and into a semiconductor thin film solar cell device structure 740 consisting of a p-type silicon carbide window 735, p-type silicon emitter 742, intrinsic SiGe absorber layer 746, and an n-type silicon base 748. Metal contacts 755 and 795 are used to extract current from the device. The refractive index of anti-reflection coating 710, encapsulant 720, and transparent conductive oxide 730 is illustratively adapted to generate a step graded index of refraction antireflection structure 725. The back of the semiconductor thin film solar cell device structure 740 is coated with a conductive, transparent indium tin oxide coating 750. The refractive index of the transparent indium tin oxide coating 750 has a value approaching 1 (but may be as high an n~1.2), thereby creating an Omni-directional reflector when combined with the underlying metallic layer 755.

According to the various embodiments, the metal contacts can be formed using conventional semiconductor processing technology known to those of ordinary skill. The optical coatings can be applied using oblique angle deposition and/or co-sputtering. The silicon-based thin films can be deposited via a variety of conventional material synthesis techniques, including sputtering, evaporation, and chemical vapor deposition.

Note that the use of wider energy gap material in the emitter layer provides various benefits for photovoltaic devices. Theories may vary with respect to the physical principals that govern, but in general, a wide energy gap emitter can reduce diffusion-driven injection of majority carriers from the base into the emitter. However, other significant dark diode current components, such as space charge recombination within the depletion region and carrier injection from the emitter into the base, are generally not improved with a typical heterojunction design. By extending the region of wide energy gap material, described herein, into the depletion region, space charge recombination can be reduced.

The illustrative embodiments utilize different energy gap material within the junction of a thin film subcell on flexible substrate to enhance both the current and voltage output thus represent an improvement over a single semiconductor material in thin film solar cell structure. The dark diode current of semiconductor devices is typically composed of several different components. At low bias, carrier recombination within the junction space charge region dominates the dark diode current of most practical p-n junction devices in which surface recombination has been minimized with proper passivation. The space charge recombination exhibits a voltage dependence with an ideality factor (n) near two and, in general, is expected to be concentrated in a region near where the electron and hole densities are equal (see for example, by way of useful background information, P. E. Dodd, T. B. Stellwag, M. R. Melloch, and M. S. Lundstrom, Surface and Perimeter Recombination in GaAs Diodes: An Experimental and Theoretical Investigation, IEEE Trans. Electron Devices, vol. 38, pp. 1253-1261, June 1991). At higher bias, diffusion-driven injection currents with ideality factors approaching one tend to describe the dark diode characteristics. All of such dark diode current mechanisms are sensitive to the material energy gap, and thus, are generally a consideration in the implementations of various embodiments.

The many features and advantages of the illustrative embodiments described herein are apparent from the above written description and thus it is intended by the appended claims to cover all such features and advantages of the invention. Further, because numerous modifications and changes will readily occur to those skilled in the art, it is not desired to limit the invention to the exact construction and operation as illustrated and described. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is to be taken only by way of example and not to otherwise limit the scope of the invention.

What is claimed is:

1. A method of manufacturing a thin film solar cell comprising:
   providing a flexible substrate having a top surface and a bottom surface;
   depositing a semiconductor thin film solar cell device structure at least partially on the top surface of the flexible substrate thereby leaving a predetermined top region of the semiconductor thin film device structure exposed; and
   coating the semiconductor thin film solar cell with a first optical coating comprising 65 nm of TCO having an index of refraction of approximately 2.19;
   coating the first optical coating with a second optical coating of 90 nm of porous TCO having an index of refraction of approximately 1.88;
   coating the second optical coating with a third optical coating of 125 nm of porous TCO having an index of refraction of approximately 1.6;
   coating the third optical coating with a fourth optical coating of 260 nm of porous TCO having an index of refraction of approximately 1.41; and
   coating the fourth optical coating with an encapsulant.

2. The method of claim 1 further comprising depositing of a porous $SiO_2$ layer on a front side of the encapsulant layer using oblique angle deposition.

3. The method of claim 1 wherein the step of depositing a semiconductor thin film solar cell device structure at least partially on the top surface of the flexible substrate comprises depositing using at least one of a physical vapor deposition, and a chemical vapor deposition.

4. The method of claim 1 further comprising the step of depositing a layer of porous material on the flexible substrate using oblique angle deposition.

5. The method of claim 1 further comprising the step of coating the flexible substrate with a conductive metal layer.

* * * * *